United States Patent [19]

Hung et al.

[11] 4,299,910
[45] Nov. 10, 1981

[54] WATER-BASED PHOTORESISTS USING STILBENE COMPOUNDS AS CROSSLINKING AGENTS

[75] Inventors: Ling K. Hung, Edison; Allen Bloom, East Windsor, both of N.J.

[73] Assignee: RCA Corporation, New York, N.Y.

[21] Appl. No.: 209,535

[22] Filed: Nov. 24, 1980

[51] Int. Cl.$^3$ .............................................. G03C 1/68
[52] U.S. Cl. .............................. 430/270; 204/159.14; 204/159.15; 430/271; 430/281; 430/311; 430/905; 430/909
[58] Field of Search .............. 430/281, 905, 909, 270, 430/271, 300, 311, 322; 204/159.14, 159.15

[56] References Cited

U.S. PATENT DOCUMENTS

| | | | |
|---|---|---|---|
| 3,070,443 | 12/1962 | Neugebauer et al. | 430/270 |
| 3,555,071 | 1/1971 | Rao et al. | 430/270 |
| 3,917,794 | 11/1975 | Akagi et al. | 427/68 |
| 3,936,497 | 2/1976 | Hirata et al. | 260/510 |
| 4,099,973 | 7/1978 | Miura et al. | 96/36 |
| 4,108,887 | 8/1978 | Fleck et al. | 560/14 |
| 4,118,182 | 10/1978 | Smith | 8/7 |
| 4,255,513 | 3/1981 | Laridon et al. | 430/281 |
| 4,259,432 | 3/1981 | Hondoh et al. | 430/281 |

*Primary Examiner*—Jack P. Brammer
*Attorney, Agent, or Firm*—Birgit E. Morris; R. Hain Swope

[57] ABSTRACT

Improved aqueous photoresist compositions comprising a water-soluble polymeric material and a photosensitive cross-linking agent, therefore, having the formula:

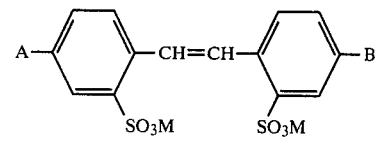

wherein, A and B are independently amino or nitro and M is an alkali metal or ammonium ion, and process of exposing and developing same.

16 Claims, No Drawings

WATER-BASED PHOTORESISTS USING STILBENE COMPOUNDS AS CROSSLINKING AGENTS

This invention relates to new aqueous photoresist compositions. More particularly, this invention relates to aqueous photoresist compositions comprising a water-soluble polymeric material and certain stilbene disulfuric acid derivatives.

BACKGROUND OF THE INVENTION

Photoresist compositions comprising a water-soluble polymeric material and a crosslinking agent therefore are well-known in the art. The use of such compositions as a negative photoresist in negative photoetching is likewise well-known. Photoetching utilizing a negative photoresist, in essence, comprises applying an aqueous photoresist composition to the substrate to be etched and selectively exposing the photoresist to light thereby causing certain portions to become insoluble upon development. The soluble portions of the photoresist are then removed and the exposed substrate etched to produce the desired pattern.

It is known that, in negative photoresists such as discussed above, the water-soluble polymeric material, e.g., polyvinylpyrrolidone, poly(vinyl alcohol), polyacrylamide and the like, is cross-linked by the photosensitive crosslinking agent upon exposure to light. Crosslinking of the polymeric material renders it insoluble in the developer solvent. Since crosslinking has taken place selectively by exposure of only selected portions of the photoresist to light through a conventional mask, removal of the remaining soluble photoresist forms the desired image. The substrate upon which the photoresist is formed is then etched to produce the desired pattern.

The use of certain bisazide compounds as photosensitive cross-linking agents in water-soluble polymeric materials such as polyvinylpyrrolidone is likewise known. The conventional use of such compounds is well documented in the patent literature. For example, U.S. Pat. No. 3,917,794 discloses water-soluble bisazide compounds such as 4,4'-diazidobenzalacetophenone-2,2'-disulfonate, 4,4'-diazidostilbene-2,2'-disulfonate and 4,4'-diazidostilbene-γ-carboxylic acid as suitable crosslinking agents with water-soluble polymeric materials in a particular process for forming a pattern of photoresist on a surface. U.S. Pat. No. 4,099,973 discloses the addition of certain alcohols to compositions containing water-soluble polymeric materials and such conventional bisazide crosslinking agents. Conventional bisazide crosslinking agents such as discussed above are disadvantageous in that they have a tendency to explode under certain circumstances.

While the use of bisazide compounds such as 4,4'-diazidostilbene-2,2'-disulfonic acid as crosslinking agents for aqueous photoresist compositions is well-known to those skilled in the art, heretofore, the corresponding amino and/or nitro compounds have not been suggested for such use.

SUMMARY OF THE INVENTION

This invention relates to aqueous photoresist compositions comprising a water-soluble polymeric material and, as a photosensitive crosslinking agent therefore, amino and/or nitro-stilbene-disulfonic acids.

DETAILED DESCRIPTION OF THE INVENTION

The photosensitive crosslinking agent for the water-soluble polymeric material in the aqueous photoresist compositions of this invention is a compound of the formula:

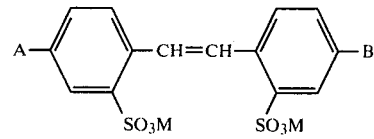

wherein A and B are independently amino or nitro and M is an alkali metal or ammonium ion.

The crosslinking agents of the aqueous photoresist compositions of this invention are known compounds. For example, U.S. Pat. No. 3,936,497 discloses a method for preparing 4,4'-diaminostilbene-2,2'-disulfonic acid from the corresponding dinitro compound by catalytic reduction. The product is disclosed only as being useful as an intermediate in the preparation of dyestuffs, particularly optical brightening agents.

It is recognized that conventional bisazide crosslinking agents will crosslink polymeric materials due to the conversion of the azide radicals by light and heat to nitrene radicals. The extremely reactive nitrene radicals crosslink the polymeric material thereby causing it to become insoluble in aqueous medium. In view of the fact that the amino and/or nitro radicals of the crosslinking agents of this invention are not converted to reactive nitrene radicals by irradiation, it is considered quite unexpected that they are useful as crosslinking agents in aqueous photoresist compositions. In fact, the exact mechanism by which the photosensitive crosslinking agents of this invention crosslink the water-soluble polymeric materials is not known to us.

The water-soluble polymeric materials useful in the photoresist compositions of this invention comprises one or, preferably, a mixture of such materials conventionally recognized as being useful in aqueous negative photoresist compositions. Such materials include, for example, polyvinylpyrrolidone, poly(vinyl alcohol), polyacrylamide, acrylamide-vinyl alcohol copolymer, acrylamide-vinylpyrrolidone copolymer and the like. A preferred polymeric material contains polyvinylpyrrolidone. For example, a preferred polymeric material is comprised of polyvinylpyrrolidone and a high-molecular weight, non-ionic homopolymer such as polyacrylamide. By "high molecular weight" is meant a molecular weight of about 5 to 6 million. Particularly preferred is a mixture of about 40 percent by weight polyvinylpyrrolidone and about 59 percent by weight polyacrylamide.

The aqueous photoresist composition of this invention is applied to the substrate to be patterned as a thin film, i.e. the aqueous composition is applied and dried to form a film in a conventional manner. The application of the resist to the substrate is carried out in a conventional manner, e.g, by dipping, spraying, spinning and the like. The concentration of the polymeric material in the photoresist composition will vary with the desired thickness of the film to be produced. Generally, however, the photoresist compositions of this invention contain from about 1 percent by weight to about 2 percent by weight, perferably about 2 percent by weight, polymeric material. The photosensitive crosslinking agent of the compositions of this invention is present in from about 0.3 percent to about 0.6 percent, preferably about 0.6 percent weight to volume in the aqueous solution. Thus, the crosslinking agent is present in from about 15 percent by weight to about 30 percent by weight based on the weight of the polymeric material. The addition of other components conventionally utilized in art-recognized aqueous photoresist compositions such as, for example, stabilizers, surfactants and the like is usually not required in the compositions of this invention.

After the film or layer of photoresist is formed, it is conventionally exposed to light through a suitable mask to cause crosslinking of the polymeric material in selected areas. In accordance with this invention, the photoresist film is preferably exposed to ultraviolet light. The photoresist layer is then treated with water to remove the soluble portions leaving a photoresist pattern of good quality which is able to withstand etching solutions conventionally used in the manufacture of electronic circuitry. The exposed portions of the substrate are then etched in a conventional manner after which the photoresist is stript utilizing, e.g., a hot aqueous alkaline solution. Suitable substrates include, for example, glass, chrome on glass, various metals, plastics such as Mylar and the like. Conventional etchants include, for example, ferric chloride solutions for metals such as iron or copper, hydrogen fluoride solutions for glass and the like.

The aqueous photoresist compositions of this invention are also useful in applications where the substrate is not etched. For example, the subject compositions may be utilized to form a patterned layer, or layers, of an inorganic material on a glass substrate for a kinescope. This process involves the conventional steps of coating the substrate with a slurry of the inorganic material in the aqueous photoresist composition, drying the coating to form a film, exposing the film to light through a suitable mask, washing with water to remove the soluble portions of the film, and heating the remaining pattern to a high temperature under vacuum to drive off the organic material and fuse the inorganic patterned layer to the glass substrate.

The treatment of the photoresist layer with light may be carried out under ambient conditions or with the exclusion of oxygen. While there is some variation among the photosensitive crosslinking agents of this invention, generally the presence of oxygen seems to promote the crosslinking reaction.

The effect of the presence of oxygen during irradiation of the individual photosensitive crosslinking agents of this invention will be appreciated from the following Examples which are intended to further illustrate the invention, it being understood that the invention is not meant to be limited to the details disclosed therein. In the Examples, parts and percentages are by weight.

EXAMPLE 1

A film about 1 micron thick was spun on each of two 1-inch square quartz slides from an aqueous solution containing 1.9% weight to volume of a polymeric material consisting of 41 percent polyvinylpyrrolidone and 59 percent polyvinylacrylamide, P-250 available from American Cyanamid Co. and 0.6 percent weight to volume 4,4′-diaminostilbene-2,2′-disulfonic acid disodium salt. One film was covered with a second quartz slide (sandwiched) and both films were irradiated by a 250 watt mercury arc Hanovia lamp at a distance of eight inches from the light source. In the film exposed to air, i.e. the unsandwiched film, the slide appeared blue during the first fifteen minutes of irradiation after which it appeared strawish. This was not observed in the sandwiched film. The absorption intensity of the films was determined and is reported in Table I. In each instance, the change in absorption intensity at approximately 250 nm represents formation of product and that at approximately 350 nm represents loss of starting material.

The reduction in absorption intensity at the higher wavelength for the unsandwiched film appeared more rapid than that of the sandwiched film indicating acceleration of the crosslinking reaction in the presence of oxygen.

Both films demonstrated good resistance to being washed away with water or concentrated nitric acid.

EXAMPLE 2

The procedure of Example 1 was repeated utilizing 4amino-4′-nitrostilbene-2,2′-disulfonic acid disodium salt as the crosslinking agent. The absorption intensity of the films is reported in Table II.

The sandwiched film showed a 44 percent reduction in absorption intensity at 430 nm after the first minute of irradiation indicating rapid loss of starting material. In contrast, the unsandwiched film showed a slow decay pattern for the peak at 430 nm. Both films were resistant to removal by washing with water. In each instance, a trace of tint remained in the film after washing.

EXAMPLE 3

The procedure of Example 1 was repeated utilizing 4,4′-dinitrostilbene-2,2′-disulfonic acid disodium salt as the crosslinking agent. The absorption intensity of the films is reported in Tables III and IV.

TABLE I

| Irradiation Exposure (Min.) | Maximum Absorption (nm) | Absorption Intensity | Maximum Absorption (nm) | Absorption Intensity |
|---|---|---|---|---|
| SANDWICHED | | | | |
| 0 | 226* | 0.74* | 354 | 1.16 |
| 1 | | | 353 | 1.02 |
| 6 | | | 354 | 0.93 |
| 15 | 240 | 0.50 | 355 | 0.75 |
| 30 | 245 | 0.50 | 355 | 0.69 |
| 45 | 245 | 0.51 | 355 | 0.62 |
| 70 | 255 | 0.55 | 352 | 0.51 |
| 90 | 245 | 0.55 | 350 | 0.47 |
| 110 | 252 | 0.56 | 343 | 0.45 |
| 130 | 250 | 0.56 | 346 | 0.45 |
| 160 | 250 | 0.55 | 350 | 0.45 |
| 230 | 250 | 0.58 | 350 | 0.42 |
| UNSANDWICHED | | | | |
| 0 | 230* | 0.53* | 355 | 1.14 |
| ½ | | | 352.5 | 1.02 |
| 5 | 250 | 0.34 | 355 | 0.81 |
| 20 | 258 | 0.43 | 353 | 0.61 |
| 40 | 250 | 0.44 | 352.5 | 0.54 |
| 70 | 255 | 0.51 | 352 | 0.40 |
| 90 | 255 | 0.50 | 351 | 0.38 |
| 110 | 250 | 0.51 | 349 | 0.35 |
| 150 | 258 | 0.50 | 350 | 0.31 |
| 181 | 255 | 0.48 | 350 | 0.28 |
| 211 | | | 355 | 0.26 |
| 281 | | | 355 | 0.26 |

*Initial absorption at lower wavelength observed with both films.

TABLE II

| Irradiation Exposure (Min.) | Maximum Absorption (nm) | Absorption Intensity | Maximum Absorption (nm) | Absorption Intensity |
|---|---|---|---|---|
| SANDWICHED | | | | |
| 0 | 315 | 1.21 | 440 | 1.31 |
| 1 | 290 | 0.77 | 430 | 0.73 |
| 3 | 300 | 0.78 | 440 | 0.74 |
| 10 | 300 | 0.80 | 438 | 0.72 |
| 30 | 300 | 0.83 | 430 | 0.71 |
| 50 | 300 | 0.77 | 430 | 0.65 |
| 70 | 300 | 0.75 | 430 | 0.67 |
| 100 | 300 | 0.84 | 430 | 0.72 |
| 175 | 300 | 0.82 | 425 | 0.68 |
| 235 | 300 | 0.76 | 425 | 0.65 |
| 305 | 300 | 0.61 | 420 | 0.51 |
| 375 | 300 | 0.70 | 420 | 0.60 |
| UNSANDWICHED | | | | |
| 0 | 300 | 0.77 | 433 | 1.26 |
| ¼ | 300 | 0.77 | 433 | 1.27 |
| ¾ | 300 | 0.77 | 433 | 1.27 |
| 1½ | 300 | 0.81 | 435 | 1.34 |
| 3 | 300 | 0.77 | 435 | 1.23 |
| 5 | 300 | 0.77 | 435 | 1.18 |
| 10 | 300 | 0.77 | 433 | 1.15 |
| 15 | 300 | 0.73 | 432 | 1.11 |
| 25 | 300 | 0.73 | 430 | 1.05 |
| 40 | 300 | 0.68 | 429 | 0.92 |
| 55 | 300 | 0.67 | 428 | 0.88 |
| 80 | 300 | 0.66 | 422.5 | 0.82 |
| 110 | 300 | 0.65 | 422.5 | 0.79 |
| 130 | 300 | 0.65 | 422 | 0.76 |
| 190 | 300 | 0.64 | 420 | 0.70 |

TABLE III

| | UNSANDWICHED | |
|---|---|---|
| IRRADIATION EXPOSURE (MIN) | MAXIMUM ABSORPTION (nm) | ABSORPTION INTENSITY |
| 0 | 364 | 1.36 |
| 1 | 383 | 1.07 |
| 5 | 390 | 1.05 |
| 15 | 385 | 2.00 |
| 45 | 400 | 0.95 |
| 80 | 400 | 0.92 |
| 270 | 400 | 0.66 |
| 430 | 385 | 0.50 |
| | 300 | 0.54 |

Both films showed a gradual loss of starting material as well as a shift in peak maximum to longer wavelength.

The sandwiched film showed two apparent shoulders upon irradiation, one at 410.0 nm and the other at 310.0 nm. Absorption intensity for both shoulders remained constant upon prolonged exposure.

Both films demonstrated resistance to being washed away with water.

TABLE IV

| | SANDWICHED | | | |
|---|---|---|---|---|
| Irradiation Exposure (Min) | Absorption 310.0 nm (Sh.) | Maximum Absorption (nm) | Absorption Intensity | Absorption at 410.0 nm (sh.) |
| 0 | — | 364 | 1.39 | — |
| 1 | 0.65 | 378 | 1.01 | 0.82 |
| 5 | 0.63 | 375 | 0.97 | 0.78 |
| 15 | 0.65 | 375 | 0.97 | 0.76 |
| 45 | 0.61 | 384 | 0.97 | 0.85 |
| 80 | 0.61 | 387 | 0.96 | 0.88 |
| 270 | 0.54 | 390 | 0.79 | 0.75 |
| 430 | 0.57 | 390 | 0.73 | 0.70 |

We claim:
1. An aqueous photoresist composition comprising:
(a) a water-soluble polymeric material, and;
(b) a crosslinking agent therefore having the formula

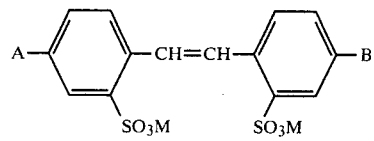

wherein A and B are independently amino or nitro, and M is an alkali metal or ammonium ion.

2. A composition according to claim 1, wherein said polymeric material contains polyvinylpyrrolidone.

3. A composition according to claim 2, wherein said polymeric material contains polyvinylpyrrolidone and at least one high molecular weight, water-soluble polymer.

4. A composition according to claim 3, wherein said high molecular weight, water-soluble polymer is a homopolymer of polyacrylamide.

5. A composition according to claim 4, wherein said polymeric material comprises about 41 percent by weight polyvinylpyrrolidone and about 51 percent by weight polyacrylamide.

6. A composition, according to claim 1, wherein said crosslinking agent is present in from about 15 percent by weight to about 30 percent by weight based on the weight of said polymeric material.

7. A composition according to claim 1, wherein said crosslinking agent is present in about 30 percent by weight based on the weight of said polymeric material.

8. A composition according to claim 1, wherein said crosslinking agent is 4,4'-diaminostilbene-2,2'-disulfonic acid disodium salt.

9. A composition according to claim 1, wherein said crosslinking agent is 4,4'-dinitrostilbene-2,2'-disulfonic acid disodium salt.

10. A composition according to claim 1, wherein said crosslinking agent is 4-amino-4'-nitrostilbene-2,2'-disulfonic acid disodium salt.

11. A process of forming a patterned layer on a substrate comprising applying to the surface of the substrate the aqueous photoresist composition of claim 1, drying said composition to form a film, selectively exposing said film to light through a mask, and developing the photoresist film to expose selected portions of the surface of said substrate.

12. A process according to claim 11, wherein the photoresist film is exposed to ultraviolet light.

13. A process according to claim 11 additionally including the step of etching the exposed substrate.

14. A process according to claim 11, wherein the polymeric material in said aqueous photoresist composition contains polyvinylpyrrolidone and at least one high molecular weight water-soluble polymer.

15. A process according to claim 14, wherein said high molecular weight, water-soluble polymer is a homopolymer of polyacrylamide.

16. A process according to claim 11, wherein said crosslinking agent is 4,4'-diaminostilbene-2,2'-disulfonic acid disodium salt.

* * * * *